US009368744B2

(12) United States Patent
Lee et al.

(10) Patent No.: US 9,368,744 B2
(45) Date of Patent: Jun. 14, 2016

(54) ORGANIC LIGHT EMITTING DIODE DEVICE INCLUDING MULTIPLE HOLE INJECTION LAYERS

(75) Inventors: Young-Shin Lee, Yongin (KR); Jae-Kook Ha, Yongin (KR); Sung-Soo Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 1272 days.

(21) Appl. No.: 13/064,532

(22) Filed: Mar. 30, 2011

(65) Prior Publication Data
US 2011/0240967 A1     Oct. 6, 2011

(30) Foreign Application Priority Data

Apr. 1, 2010 (KR) .................. 10-2010-0030107

(51) Int. Cl.
*H01L 51/50* (2006.01)
(52) U.S. Cl.
CPC ........ *H01L 51/5088* (2013.01); *H01L 51/5004* (2013.01); *H01L 2251/552* (2013.01)
(58) Field of Classification Search
CPC . H01L 51/50; H01L 51/5004; H01L 51/5088; H01L 51/5092; H01L 2251/552; H01L 2251/50; H01L 51/5008
USPC .................................................. 313/504, 506
See application file for complete search history.

(56) References Cited

U.S. PATENT DOCUMENTS

| 7,372,199 B2 | 5/2008 | Yamazaki et al. |
| 2004/0185300 A1 | 9/2004 | Hatwar et al. |
| 2005/0255334 A1 | 11/2005 | Kang et al. |
| 2006/0214151 A1* | 9/2006 | Abe et al. ........................ 257/13 |
| 2007/0141395 A1* | 6/2007 | Chun et al. .................... 428/690 |
| 2007/0141396 A1* | 6/2007 | Chun et al. .................... 428/690 |
| 2008/0078678 A1* | 4/2008 | Fujimoto et al. ................ 205/92 |
| 2008/0272369 A1* | 11/2008 | Kang et al. ...................... 257/40 |
| 2009/0146552 A1* | 6/2009 | Spindler et al. ............... 313/504 |
| 2009/0200542 A1* | 8/2009 | Cho et al. ......................... 257/40 |
| 2009/0226757 A1* | 9/2009 | Song et al. .................... 428/690 |
| 2009/0315452 A1 | 12/2009 | Lim et al. |

(Continued)

FOREIGN PATENT DOCUMENTS

| CN | 1988203 A | 6/2007 |
| CN | 101222023(A) | 7/2008 |
| CN | 101399317 A | 4/2009 |

(Continued)

OTHER PUBLICATIONS

Machine English translation of JP 2009-283787 to Sakamoto.*

(Continued)

*Primary Examiner* — Anne Hines
(74) *Attorney, Agent, or Firm* — Lee & Morse, P.C.

(57) ABSTRACT

An organic light emitting diode device, including a first electrode, a second electrode facing the first electrode, and a light emitting member disposed between the first electrode and the second electrode, the light emitting member including at least one light emitting unit. At least one of the light emitting units may include a first hole injection layer, a second hole injection layer, a hole transport layer, and an emission layer, and a difference between a HOMO energy level of the first hole injection layer and a LUMO energy level of the second hole injection layer may be smaller than about 0.5 eV.

15 Claims, 4 Drawing Sheets

(56) References Cited

U.S. PATENT DOCUMENTS

| | | | |
|---|---|---|---|
| 2010/0133522 A1* | 6/2010 | Pieh et al. ........................ | 257/40 |
| 2010/0148166 A1* | 6/2010 | Ushikubo et al. ................ | 257/40 |

FOREIGN PATENT DOCUMENTS

| | | |
|---|---|---|
| CN | 101682000(A) | 3/2010 |
| CN | 102273320 A | 12/2011 |
| EP | 2065950 A2 | 6/2009 |
| EP | 2-247-163 A2 | 3/2010 |
| EP | 2-299-786 A2 | 3/2011 |
| JP | 2005-032618 A | 2/2005 |
| JP | 2006-164771 | 6/2006 |
| JP | 2006-324016 A | 11/2006 |
| JP | 2007-123611 A | 5/2007 |
| JP | 2007-173779 A | 7/2007 |
| JP | 2007-173780 A | 7/2007 |
| JP | 2007-329453 A | 12/2007 |
| JP | 2009-088525 A | 4/2009 |
| JP | 2009-212514 A | 9/2009 |
| JP | 2009-283787 A | 12/2009 |
| KR | 10-0511875 | 9/2005 |
| KR | 10-2007-0065546 A | 6/2007 |
| KR | 10-0898304 | 5/2009 |
| KR | 10-2009-0095022 A | 9/2009 |
| TW | 200642521 | 12/2005 |
| WO | WO-2007/105906 A1 | 9/2007 |
| WO | WO-2009/040401 A1 | 4/2009 |
| WO | WO-2009/091231 A2 | 7/2009 |
| WO | WO-2009/145062 A1 | 12/2009 |

OTHER PUBLICATIONS

Search Report mailed Apr. 3, 2013 in corresponding European Patent Application No. 11250417.0.

* cited by examiner

ORGANIC LIGHT EMITTING DIODE DEVICE INCLUDING MULTIPLE HOLE INJECTION LAYERS

BACKGROUND

1. Field

Embodiments relate to an organic light emitting diode device.

2. Description of the Related Art

Recently, an organic light emitting diode (OLED) device has been drawing attention as a display device and a lighting device.

An organic light emitting diode device may include two electrodes and an emission layer interposed therebetween. Electrons injected from one electrode are combined with holes injected from the other electrode in an emission layer to generate excitons which release energy while emitting light.

Since the organic light emitting diode device emits light by itself without a particular light source, it has low power consumption and excellent response speed, viewing angle, and contrast ratio.

SUMMARY

It is a feature of an embodiment to provide an organic light emitting diode device configured to increase luminous efficiency and decrease driving voltage while having stable color characteristics.

At least one of the above and other features and advantages may be realized by providing an organic light emitting diode device, including a first electrode, a second electrode facing the first electrode, and a light emitting member disposed between the first electrode and the second electrode, the light emitting member including at least one light emitting unit. At least one of the light emitting units may include a first hole injection layer, a second hole injection layer, a hole transport layer, and an emission layer, and a difference between a HOMO energy level of the first hole injection layer and a LUMO energy level of the second hole injection layer may be smaller than about 0.5 eV.

The HOMO energy level of the first hole injection layer may be higher than the LUMO energy level of the second hole injection layer.

The HOMO energy level of the first hole injection layer may be about 4.5 to about 6.5 eV, and the LUMO energy level of the second hole injection layer may be about 4.3 to about 6.3 eV.

A HOMO energy level of the second hole injection layer may be higher than the HOMO energy level of the first hole injection layer and a HOMO energy level of the hole transport layer.

The first hole injection layer and the second hole injection layer may have different compositions.

The HOMO of the first hole injection layer may have an energy level that is different from that of the LUMO of the second hole injection layer.

The first hole injection layer may include a triphenylamine derivative, and the second hole injection layer may include a hexaazatriphenylene derivative.

The first hole injection layer may include a triphenylamine derivative, and the second hole injection layer may include a hexaazatriphenylene derivative.

The first hole injection layer may include N,N'-diphenyl-N,N'-bis(3-methylphenyl)-1,1'-biphenyl-4,4'-diamine, and the second hole injection layer may include 2,3,6,7,10,11-hexacyano-1,4,5,8,9,12-hexaazatriperylene.

The second hole injection layer may be thinner than the first hole injection layer.

The second hole injection layer may have a thickness of about 10 to about 200 Å.

The light emitting member may include at least two light emitting units each displaying a different color.

The light emitting member may include a first light emitting unit and a second light emitting unit stacked on the first light emitting unit.

The light emitting member may include a red light emitting unit, a green light emitting unit, a blue light emitting unit, an orange light emitting unit, a white light emitting unit, or a combination thereof.

White color light may be displayed from a single organic light emitting diode by combining lights of at least two light emitting units each displaying a different color.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Korean Patent Application No. 10-2010-0030107, filed on Apr. 1, 2010, in the Korean Intellectual Property Office, and entitled: "Organic Light Emitting Diode Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
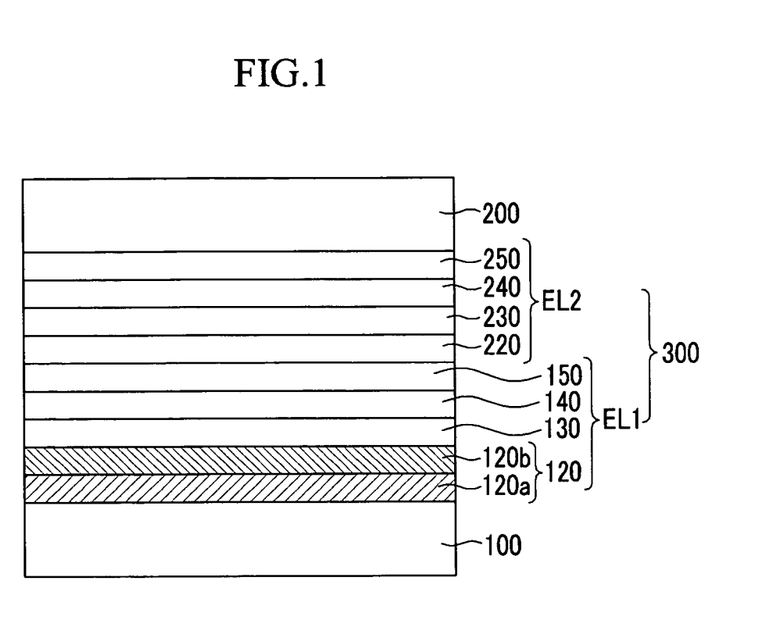
FIG. 1 illustrates a cross-sectional view of an organic light emitting diode device according to an embodiment.

Referring to FIG. 1, an organic light emitting diode device according to an embodiment will now be described in detail.

FIG. 1 illustrates a cross-sectional view of an organic light emitting diode device according to an embodiment.

Referring to FIG. 1, the organic light emitting diode device may include a lower electrode 100, a light emitting member 300 disposed on the lower electrode 100, and an upper electrode 200 disposed on the light emitting member 300.

The lower electrode 100 may be an anode. The lower electrode 100 may be formed of a transparent conductor or an opaque conductor. The transparent conductor may include, e.g., ITO, IZO, or a combination thereof. The opaque conductor may include, e.g., aluminum (Al), silver (Ag), or a combination thereof. In the case that the lower electrode 100 is a transparent electrode, the organic light emitting diode (OLED) may be a bottom emission type that emits light through the bottom thereof.

The light emitting member 300 may include a lower light emitting unit EL1 and an upper light emitting unit EL2 that are sequentially stacked. Embodiments, however, are not limited thereto, and the light emitting member 300 may include one or more light emitting units.

The light emitting unit EL1 and the upper light emitting unit EL2 may each display different colors. Each of the light emitting unit EL1 and the upper light emitting unit EL2 may include a red light emitting unit, a green light emitting unit, a blue light emitting unit, an orange light emitting unit, a white light emitting unit, or a combination thereof. White color light may be displayed by the organic light emitting diode (OLED) device, e.g., by combining the color lights emitted from the lower light emitting unit EL1 and the upper light emitting unit EL2. Thus, a single organic light emitting diode (OLED) may display white color light.

In the example embodiment illustrated in FIG. 1, the lower light emitting unit EL1 includes a hole injection layer (HIL) 120, a hole transport layer (HTL) 130 disposed on the hole injection layer (HIL) 120, an emission layer 140 displaying a color, and an electron transport layer (ETL) 150 disposed on the emission layer 140. The hole injection layer (HIL) 120 includes a lower hole injection layer (HIL) 120a and an upper hole injection layer (HIL) 120b.

The lower hole injection layer (HIL) 120a and the upper hole injection layer (HIL) 120b may be formed of respective materials having different energy levels. The difference between the HOMO energy level of the lower hole injection layer (HIL) 120a and the LUMO energy level of the upper hole injection layer (HIL) 120b may be smaller than about 0.5 eV. The HOMO energy level of the lower hole injection layer (HIL) may be about 4.5 to about 6.5 eV, and the LUMO energy level of the upper hole injection layer (HIL) may be about 4.3 to about 6.3 eV.

The lower hole injection layer (HIL) 120a may be formed of a triphenylamine derivative. The upper hole injection layer (HIL) 120b may be formed of, or may include a hexaazatriperylene derivative.

The triphenylamine derivative may include, e.g., N,N'-diphenyl-N,N'-bis(3-methylphenyl)-1,1'-biphenyl-4,4'-diamine. The hexaazatriperylene derivative may include, e.g., 2,3,6,7,10,11-hexacyano-1,4,5,8,9,12-hexaazatriperylene.

The upper hole injection layer (HIL) 120b may be thinner than the lower hole injection layer (HIL) 120a. For example, the upper hole injection layer (HIL) 120b may have a thickness of about 10 to about 200 Å. In an implementation, the lower hole injection layer (HIL) 120a may have a thickness of about 100 to about 650 Å, and the upper hole injection layer (HIL) 120b may have a thickness of about 50 to about 200 Å.

The hole transport layer (HTL) 130 may be disposed on the hole injection layer (HIL) 120. The hole transport layer (HTL) 130 may be formed of, e.g., N-(biphenyl-4-yl)-9,9-dimethyl-N-(4-(9-phenyl-9H-carbazol-3-yl)phenyl)-9H-fluorine-2-amine, or the like.

The emission layer 140 may include a light emitting material displaying a particular color. For example, the emission layer 140 may display a basic color such as blue, green, or red, or a combination of the colors.

The electron transport layer (ETL) 150 may be disposed on the emission layer 140. The electron transport layer (ETL) 150 may transfer electrons to the emission layer 140.

The upper light emitting unit EL2 may include an upper light emitting unit hole injection layer (HIL) 220, an upper light emitting unit hole transport layer (HTL) 230 disposed on the upper light emitting unit hole injection layer (HIL) 220, an upper light emitting unit emission layer 240 displaying a color, and an upper light emitting unit electron transport layer (ETL) 250 disposed on the upper light emitting unit emission layer 240.

Differently from the above-described hole injection layer (HIL) 120, the upper light emitting unit hole injection layer (HIL) 220 may be formed as a single layer. The upper light emitting unit hole injection layer (HIL) 220 may be formed of, e.g., 2,3,6,7,10,11-hexacyano-1,4,5,8,9,12-hexaazatriphenylene.

The upper light emitting unit hole transport layer (HTL) 230 may be formed on the upper light emitting unit hole injection layer (HIL) 220. The upper light emitting unit hole transport layer (HTL) 230 may be formed of N-(biphenyl-4-yl)-9,9-dimethyl-N-(4-(9-phenyl-9H-carbazol-3-yl)phenyl)-9H-fluorene-2-amine.

The upper light emitting unit emission layer 240 may include a light emitting material displaying a particular color, for example, a basic color such as blue, green, or red, or a combination of the colors. In an implementation, the upper light emitting unit emission layer 240 may emit light of a different color from that emitted from the emission layer 140 of the lower light emitting unit.

The upper light emitting unit electron transport layer (ETL) 250 may be disposed on the upper light emitting unit emission layer 240. The upper light emitting unit electron transport layer (ETL) 250 may transfer electrons from the upper electrode 200 to the upper light emitting unit emission layer 240.

The upper electrode 200 may be a cathode. In the case that the upper electrode 200 is a transparent electrode, the organic light emitting diode may be a top emission type that emits light from the light emitting member 300 to the top thereof. In this case, the upper electrode 200 may be formed of a conductive oxide such as ITO or IZO, or it may be formed of aluminum (Al) or silver (Ag) having a small thickness.

The lower light emitting unit EL1 will now be described with reference to FIG. 2 along with FIG. 1.

Figure 2:
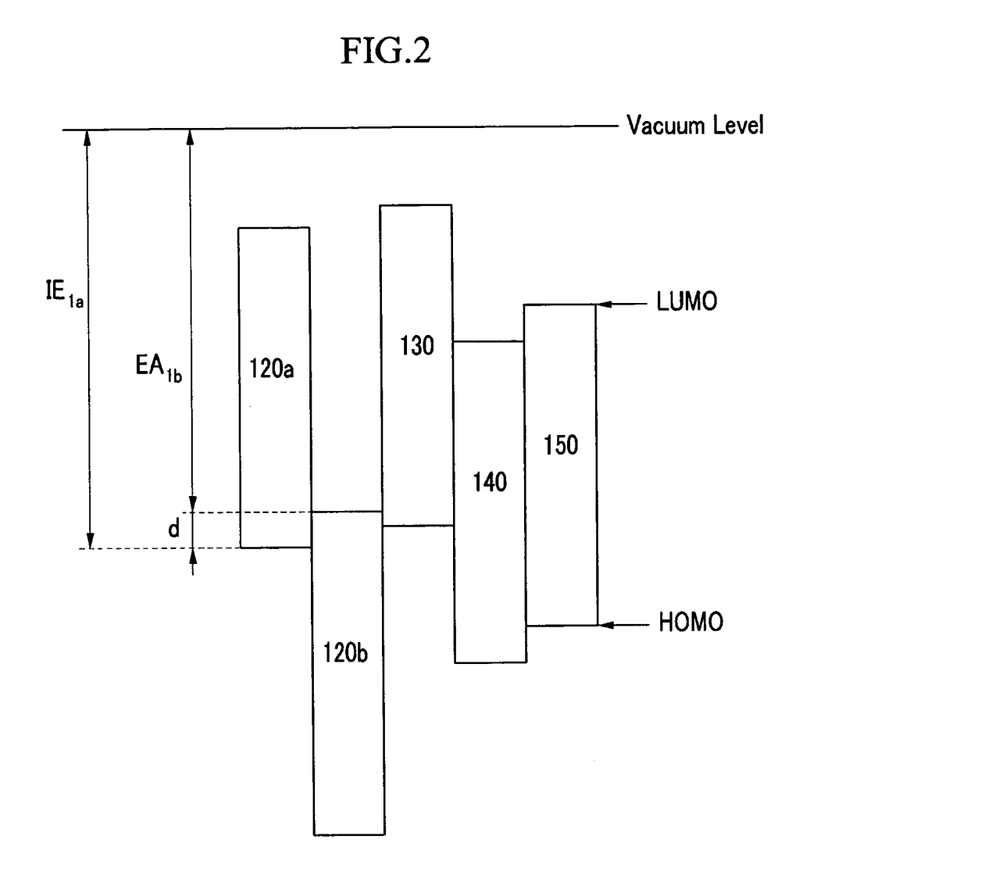
FIG. 2 illustrates a schematic diagram showing an energy level of a lower light emitting unit EL1.

FIG. 2 illustrates a schematic diagram showing an energy level of a lower light emitting unit EL1 according to an embodiment.

Referring to FIG. 2, the lower hole injection layer (HIL) 120a, the upper hole injection layer (HIL) 120b, the hole transport layer (HTL) 130, the emission layer 140, and the electron transport layer (ETL) 150 include a highest occupied molecular orbital (HOMO) energy level and a lowest unoccupied molecular orbital (LUMO) energy level, individually, and an energy band gap exists between the HOMO energy level and the LUMO energy level of each layer.

When a vacuum level is called an energy level 0, the HOMO energy level is ionization energy (IE) and the LUMO energy level is called an electron affinity (EA).

Herein, the ionization energy ($IE_{1a}$) of the lower hole injection layer (HIL) 120a, that is, the HOMO energy level of the lower hole injection layer (HIL) 120a, may be greater than the electron affinity ($EA_{1b}$) of the upper hole injection layer (HIL) 120b, that is, the LUMO energy level of the upper hole injection layer (HIL) 120b. In an embodiment, the difference (d) may be smaller than about 0.5 eV. For example, the ionization energy ($IE_{1a}$) of the lower hole injection layer (HIL) 120a, that is, the HOMO energy level of the lower hole injection layer (HIL) 120a, may be about 4.5 to about 6.5 eV, and the electron affinity ($EA_{1b}$) of the upper hole injection layer (HIL) 120b, that is, the LUMO energy level of the upper hole injection layer (HIL) 120b, may be about 4.3 to about 6.3 eV.

In an embodiment, the HOMO energy level of the upper hole injection layer (HIL) 120b may be higher than the HOMO energy level of the lower hole injection layer (HIL) 120a and the HOMO energy level of the hole transport layer (HTL) 130.

By forming the hole injection layer (HIL) as a bi-layer with the two layers each having a different energy level, the efficiency may be improved and the power consumption may be reduced.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Fabrication of Organic Light Emitting Diode Device

Example 1

After ITO was deposited on the upper surface of a glass substrate and patterned, N,N'-diphenyl-N,N'-bis(3-methylphenyl)-1,1'-biphenyl-4,4'-diamine (TPD) was deposited as a lower hole injection layer (HIL) on the patterned structure in a thickness of about 100 to about 650 Å, 2,3,6,7,10,11-hexacyano-1,4,5,8,9,12-hexaazatriphenylene was deposited as an upper hole injection layer (HIL) in a thickness of about 50 to about 200 Å, and N4,N4'-diphenyl-N4-(9-phenyl-9H-carbazol-2-yl)-N4'-(9-phenyl-9H-carbazol-3-yl)biphenyl-4,4'-diamine was deposited as a hole transport layer (HTL) in a thickness of about 100 to about 550 Å. Subsequently, a blue emission layer was deposited on the resultant structure as a lower emission layer, and an electron transport layer (ETL) was deposited. Subsequently, 2,3,6,7,10,11-hexacyano-1,4,5,8,9,12-hexaazatriphenylene, N-(biphenyl-4-yl)-9,9-dimethyl-N-(4-(9-phenyl-9H-carbazol-3-yl)phenyl)-9H-fluorene-2-amine, a phosphorescent red emission layer, and a phosphorescent green emission layer were sequentially deposited as an upper light emitting unit hole injection layer (HIL), an upper light emitting unit hole transport layer (HTL), an upper light emitting unit emission layer, and an upper light emitting unit electron transport layer (ETL), and then aluminum (Al) was deposited as an upper electrode.

Example 2

In this example, the lower light emitting unit was a blue light emitting unit, and the upper light emitting unit was an orange light emitting unit.

After ITO was deposited on the upper surface of a glass substrate and patterned, N4,N4'-diphenyl-N4-(9-phenyl-9H-carbazol-2-yl)-N4'-(9-phenyl-9H-carbazol-3-yl)biphenyl-4,4'-diamine was deposited as a lower hole injection layer (HIL) in a thickness of about 600 Å, 2,3,6,7,10,11-hexacyano-1,4,5,8,9,12-hexaazatriphenylene was deposited as an upper hole injection layer (HIL) in a thickness of about 50 Å, and N-(biphenyl-4-yl)-9,9-dimethyl-N-(4-(9-phenyl-9H-carbazol-3-yl)phenyl)-9H-fluorene-2-amine was deposited as a hole transport layer (HTL) in a thickness of about 100 to about 650 Å. Subsequently, a blue emission layer was deposited as a lower emission layer on the resultant structure, and an electron transport layer (ETL) was deposited thereon. Subsequently, N4,N4'-diphenyl-N4-(9-phenyl-9H-carbazol-2-yl)-N4'-(9-phenyl-9H-carbazol-3-yl)biphenyl-4,4'-diamine, N-(biphenyl-4-yl)-9,9-dimethyl-N-(4-(9-phenyl-9H-carbazol-3-yl)phenyl)-9H-fluorene-2-amine, an orange emission layer, and an electron transport layer (ETL) were sequentially deposited as an upper light emitting unit hole injection layer (HIL), an upper light emitting unit hole transport layer (HTL), an upper light emitting unit emission layer, and an upper light emitting unit electron transport layer (ETL), and aluminum was deposited as an upper electrode.

Example 3-1

In the present example, the lower light emitting unit was a blue light emitting unit, and the upper light emitting unit was a light emitting unit including a red emission layer and a green emission layer sequentially stacked therein.

After ITO was deposited on the upper surface of a glass substrate and patterned, N4,N4'-diphenyl-N4-(9-phenyl-9H-carbazol-2-yl)-N4'-(9-phenyl-9H-carbazol-3-yl)biphenyl-4,4'-diamine was deposited as a lower hole injection layer (HIL) in a thickness of about 600 Å, 2,3,6,7,10,11-hexacyano-1,4,5,8,9,12-hexaazatriphenylene was deposited as an upper hole injection layer (HIL) in a thickness of about 50 Å, and N-(biphenyl-4-yl)-9,9-dimethyl-N-(4-(9-phenyl-9H-carbazol-3-yl)phenyl)-9H-fluorene-2-amine was deposited as a hole transport layer (HTL) in a thickness of about 100 to about 650 Å. Subsequently, a blue emission layer was deposited as a lower emission layer on the resultant structure, and an electron transport layer (ETL) was deposited. Subsequently, N4,N4'-diphenyl-N4-(9-phenyl-9H-carbazol-2-yl)-N4'-(9-phenyl-9H-carbazol-3-yl)biphenyl-4,4'-diamine, N-(biphenyl-4-yl)-9,9-dimethyl-N-(4-(9-phenyl-9H-carbazol-3-yl)phenyl)-9H-fluorene-2-amine, a fluorescent red emission layer, a fluorescent green emission layer, and an electron transport layer (ETL) were sequentially deposited as an upper light emitting unit hole injection layer (HIL), an upper light emitting unit hole transport layer (HTL), an upper light emitting unit emission layer, and an upper light emitting unit electron transport layer (ETL), and aluminum was deposited as an upper electrode.

Example 3-2

An organic light emitting diode device was fabricated according to the same method as Example 3-1, except that the lower hole injection layer (HIL) and the upper hole injection layer (HIL) were deposited in thicknesses of about 550 Å and about 100 Å, respectively.

Example 3-3

An organic light emitting diode device was fabricated according to the same method as Example 3-1, except that the lower hole injection layer (HIL) and the upper hole injection layer (HIL) were deposited in thicknesses of about 450 Å and about 200 Å, respectively.

Comparative Example 1

An organic light emitting diode device was fabricated according to the same method as Example 1, except that a single layer hole injection layer (HIL) was formed of 2,3,6,7,10,11-hexacyano-1,4,5,8,9,12-hexaazatriphenylene (a single layer) in a thickness of about 650 Å.

Comparative Example 2

An organic light emitting diode device was fabricated according to the same method as Example 2, except that a single layer hole injection layer (HIL) was formed of 2,3,6,7,10,11-hexacyano-1,4,5,8,9,12-hexaazatriphenylene (a single layer) in a thickness of about 650 Å.

Comparative Example 3

An organic light emitting diode device was fabricated according to the same method as Example 3-1, except that a single layer hole injection layer (HIL) was formed of 2,3,6,7,10,11-hexacyano-1,4,5,8,9,12-hexaazatriphenylene (a single layer) in a thickness of about 650 Å.

Evaluation—1

The luminous efficiencies and color characteristics of the organic light emitting diode device fabricated according to Example 1 and Comparative Example 1 will be described with reference to FIGS. 3 and 4.

Figure 3:
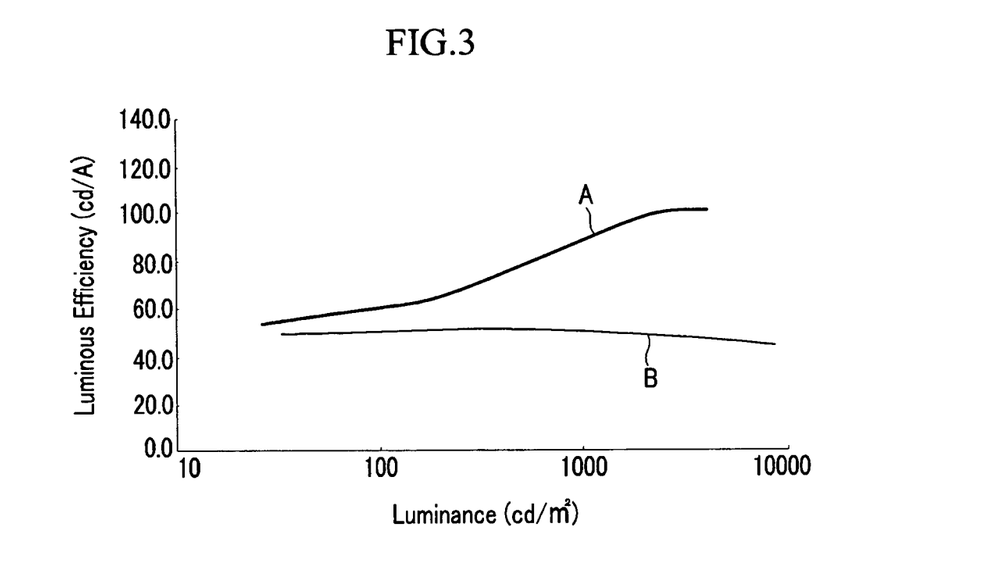
FIG. 3 illustrates a graph showing luminous efficiencies according to luminances of organic light emitting diode devices according to Example 1 and Comparative Example 1.
Figure 4:
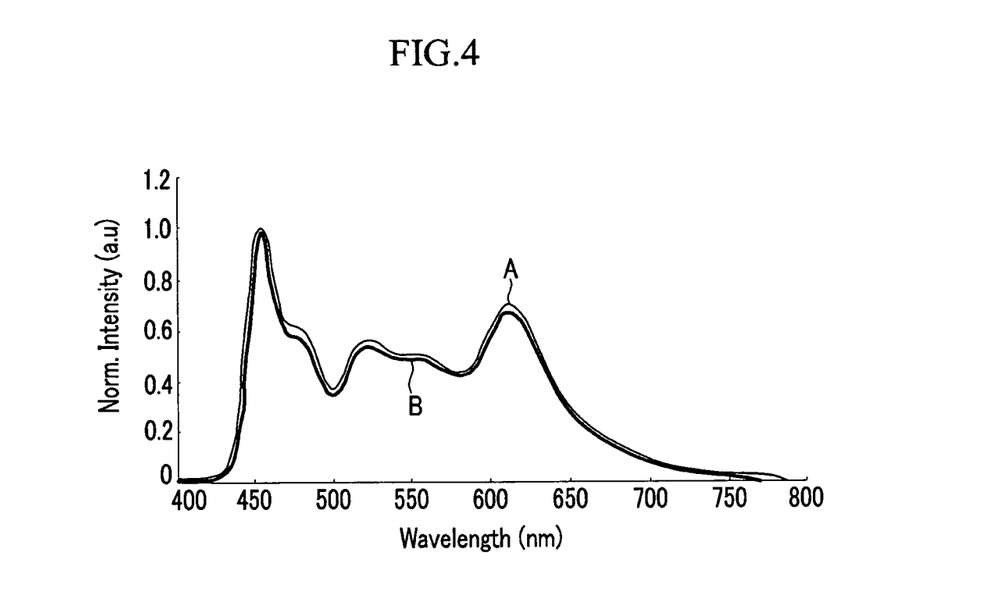
FIG. 4 illustrates a graph showing white light emission of organic light emitting diode devices according to Example 1 and Comparative Example 1.

FIG. 3 illustrates a graph showing luminous efficiencies according to luminances of organic light emitting diode devices according to Example 1 and Comparative Example 1, and FIG. 4 illustrates a graph showing white light emission of organic light emitting diode devices according to Example 1 and Comparative Example 1.

Referring to FIG. 3, the organic light emitting diode device (A) according to Example 1 had higher luminous efficiency based on luminance than the organic light emitting diode device (B) according to Comparative Example 1. Referring to FIG. 4, the organic light emitting diode device (A) according to Example 1 and the organic light emitting diode device (B) according to Comparative Example 1 had similar light intensity based on wavelength, and thus they had a white light emitting characteristic of a similar level.

It can be seen from the results that the organic light emitting diode device (A) according to Example 1 showed a light emitting characteristic of a similar level, but had higher luminous efficiency based on the luminance, as compared with the organic light emitting diode device (B) according to Comparative Example 1.

Evaluation—2

The luminous efficiencies and color characteristics of the organic light emitting diode device according to Example 2 and Comparative Example 2 will now be described with reference to Table 1 and FIG. 5.

Figure 5:
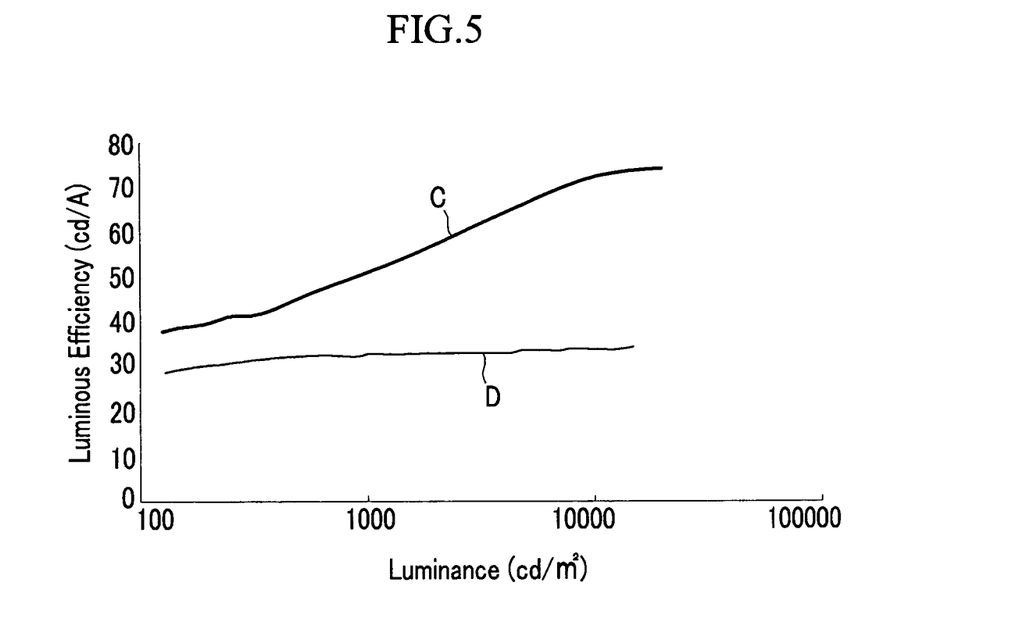
FIG. 5 illustrates a graph showing luminous efficiencies of organic light emitting diode devices according to Example 2 and Comparative Example 2.

FIG. 5 illustrates a graph showing luminous efficiencies of organic light emitting diode devices according to Example 2 and Comparative Example 2.

TABLE 1

|  | Efficiency | | | Color coordinate (CIE) | |
| --- | --- | --- | --- | --- | --- |
|  | cd/A | lm/W | EQE (%) | x | y |
| Example 2 | 69.1 | 20.1 | 30.6 | 0.319 | 0.317 |
| Comparative Example 2 | 33.0 | 10.0 | 13.6 | 0.309 | 0.295 |

It may be seen from Table 1 and FIG. 5 that the organic light emitting diode device (C) according to Example 2 had higher efficiency than the organic light emitting diode device (D) according to Comparative Example 2, and a similar color coordinate level to the organic light emitting diode device (D) according to Comparative Example 2.

Evaluation—3

The luminous efficiencies and color characteristics of the organic light emitting diode devices fabricated according to Examples 3-1 to 3-3 and Comparative Example 3 will now be described with reference to Table 2 and FIG. 6.

Figure 6:
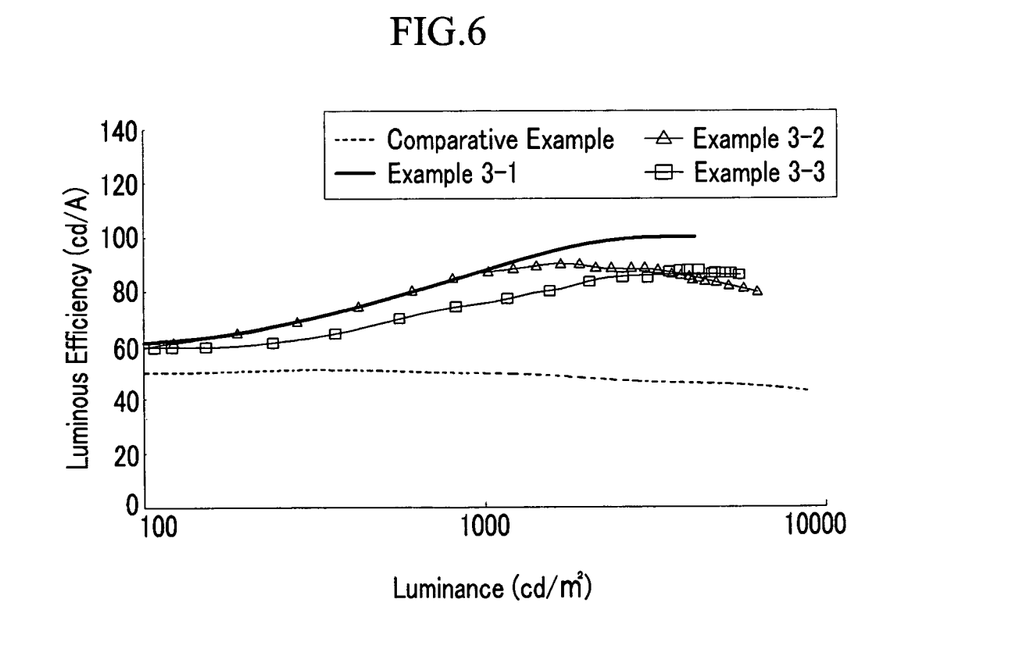
FIG. 6 illustrates a graph showing luminous efficiencies of organic light emitting diode devices according to Examples 3-1 to 3-3 and Comparative Example 3.

FIG. 6 illustrates a graph showing luminous efficiencies of organic light emitting diode devices according to Examples 3-1 to 3-3 and Comparative Example 3.

TABLE 2

|  | Efficiency | | | Color coordinate (CIE) | |
| --- | --- | --- | --- | --- | --- |
|  | cd/A | lm/W | EQE (%) | x | y |
| Example 3-1 | 99.6 | 39.5 | 46.5 | 0.333 | 0.335 |
| Example 3-2 | 85.3 | 30.2 | 39.8 | 0.334 | 0.335 |
| Example 3-3 | 85.8 | 35.7 | 39.9 | 0.334 | 0.336 |
| Comparative Example 3 | 46.1 | 20.3 | 21.5 | 0.334 | 0.333 |

It can be seen from Table 2 and FIG. 6 that the organic light emitting diode device according to Examples 3-1 to 3-3 had higher efficiency than the organic light emitting diode device according to Comparative Example 3, and similar color coordinates to the organic light emitting diode device according to Comparative Example 3.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:
1. An organic light emitting diode device, comprising:
   a first electrode;
   a second electrode facing the first electrode; and
   a light emitting member disposed between the first electrode and the second electrode, the light emitting member including at least two light emitting units including a first light emitting unit and a second light emitting unit stacked on the first light emitting unit, the first and second light emitting units each displaying a different color,
   wherein the first light emitting unit includes a first hole injection layer, a second hole injection layer directly on the first hole injection layer, a first hole transport layer directly on the second hole injection layer, and a first emission layer, a difference between a HOMO energy level of the first hole injection layer and a LUMO energy level of the second hole injection layer being smaller than about 0.5 eV, wherein the second light emitting unit includes a third hole injection layer, a second hole transport layer, and an second emission layer, and the first hole injection layer includes a different material from the first hole transport layer.

2. The organic light emitting diode device as claimed in claim 1, wherein an ionization energy of the first hole injection layer is higher than an electron affinity of the second hole injection layer.

3. The organic light emitting diode device as claimed in claim 1, wherein an ionization energy of the first hole injection layer is about 4.5 to about 6.5 eV, and an electron affinity of the second hole injection layer is about 4.3 to about 6.3 eV.

4. The organic light emitting diode device as claimed in claim 1, wherein an ionization energy of the second hole injection layer is higher than an ionization energy of the first hole injection layer and an ionization energy of the first hole transport layer.

5. The organic light emitting diode device as claimed in claim 1, wherein the first hole injection layer and the second hole injection layer have different compositions.

6. The organic light emitting diode device as claimed in claim 5, wherein the HOMO energy level of the first hole injection layer is different from the LUMO energy level of the second hole injection layer.

7. The organic light emitting diode device as claimed in claim 6, wherein:

the first hole injection layer includes a triphenylamine derivative, and the second hole injection layer includes a hexaazatriphenylene derivative.

8. The organic light emitting diode device as claimed in claim 1, wherein:

the first hole injection layer includes a triphenylamine derivative, and the second hole injection layer includes a hexaazatriphenylene derivative.

9. The organic light emitting diode device as claimed in claim 1, wherein:

the first hole injection layer includes N,N'-diphenyl-N,N-bis(3-methylphenyl)-1,1'-biphenyl-4,4'-diamine, and the second hole injection layer includes 2,3,6,7,10,11-hexacyano-1,4,5,8,9,12-hexaazatriphenylene.

10. The organic light emitting diode device as claimed in claim 1, wherein the second hole injection layer is thinner than the first hole injection layer.

11. The organic light emitting diode device as claimed in claim 10, wherein the second hole injection layer has a thickness of about 10 to about 200 Å.

12. The organic light emitting diode device as claimed in claim 1, wherein the first light emitting unit or the second light emitting unit includes a red light emitting unit, a green light emitting unit, a blue light emitting unit, an orange light emitting unit, a white light emitting unit, or a combination thereof.

13. The organic light emitting diode device as claimed in claim 1, wherein white color light is displayed from a single organic light emitting diode by combining lights of at least two light emitting units each displaying a different color.

14. The organic light emitting diode device as claimed in claim 1, wherein the first light emitting unit further comprises a first electron transport layer disposed on the first emission layer, wherein the first electron transport layer is directly adjacent to the third hole injection layer of the second light emitting unit.

15. The organic light emitting diode device as claimed in claim 1, wherein the third hole injection layer of the second light emitting unit is disposed directly on the first electron transport layer of the first light emitting unit.

* * * * *